(12) United States Patent
Alissa et al.

(10) Patent No.: US 12,464,686 B2
(45) Date of Patent: *Nov. 4, 2025

(54) SYSTEMS AND METHODS FOR IMMERSION-COOLED DATACENTERS

(71) Applicant: Microsoft Technology Licensing, LLC, Redmond, WA (US)

(72) Inventors: Husam Atallah Alissa, Redmond, WA (US); Stephan Wayne Gilges, Seattle, WA (US); Eric C. Peterson, Woodinville, WA (US); Sean Michael James, Olympia, WA (US); Christian L. Belady, Mercer Island, WA (US); Marcus Felipe Fontoura, Medina, WA (US); Ioannis Manousakis, Redmond, WA (US); Bharath Ramakrishnan, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/238,046

(22) Filed: Aug. 25, 2023

(65) Prior Publication Data
US 2023/0403830 A1    Dec. 14, 2023

Related U.S. Application Data

(63) Continuation of application No. 17/308,739, filed on May 5, 2021, now Pat. No. 11,792,962.

(51) Int. Cl.
*H05K 7/20* (2006.01)

(52) U.S. Cl.
CPC ......... *H05K 7/20827* (2013.01); *H05K 7/203* (2013.01); *H05K 7/20836* (2013.01)

(58) Field of Classification Search
CPC .............. H05K 7/203; H05K 7/20827–20836
See application file for complete search history.

(56) References Cited

U.S. PATENT DOCUMENTS

| | | | | |
|---|---|---|---|---|
| 5,293,754 A | * | 3/1994 | Mizuno | H01L 23/473 |
| | | | | 165/286 |
| 9,335,802 B2 | * | 5/2016 | Shelnutt | H05K 7/203 |
| (Continued) | | | | |

OTHER PUBLICATIONS

Communication pursuant to Article 94(3) received in European Application No. 22720176.1, mailed on Oct. 22, 2024, 3 pages.

(Continued)

*Primary Examiner* — Robert J Hoffberg
(74) *Attorney, Agent, or Firm* — Ray Quinney & Nebeker P.C.; Paul N. Taylor

(57) ABSTRACT

A thermal management system for cooling electronic devices includes an immersion cooling system, a vapor buffer tank, and a liquid buffer tank. The immersion cooling system includes an immersion tank defining an immersion chamber, a working fluid in the immersion chamber, and a condenser. A liquid portion of the working fluid defines an immersion bath in the immersion chamber and a vapor portion defines a headspace above the immersion bath in the immersion chamber. The condenser condenses the vapor portion of the working fluid to the liquid portion of the working fluid. The vapor buffer tank is in fluid communication with the headspace, and a vapor valve selectively allows fluid communication between the vapor buffer tank and the headspace. The liquid buffer tank is in fluid communication with the immersion chamber, and a liquid valve selectively allows fluid communication between the liquid buffer tank and the immersion chamber.

12 Claims, 4 Drawing Sheets

(56) References Cited

U.S. PATENT DOCUMENTS

| | | | | |
|---|---|---|---|---|
| 9,464,854 B2 * | 10/2016 | Shelnutt | ............. | H05K 7/20236 |
| 9,844,166 B2 * | 12/2017 | Shelnutt | ................. | F28F 27/02 |
| 10,966,349 B1 * | 3/2021 | Lau | ................... | H05K 7/20236 |
| 11,076,505 B2 * | 7/2021 | Gao | ................... | H05K 7/20381 |
| 11,262,135 B2 * | 3/2022 | Tung | ................... | H05K 7/203 |
| 11,317,543 B1 * | 4/2022 | Gao | ................... | F28D 15/0266 |
| 11,627,685 B2 * | 4/2023 | Hashimoto | ........ | H05K 7/20236 |
| | | | | 361/699 |
| 11,792,962 B2 * | 10/2023 | Alissa | .................... | H05K 7/203 |
| | | | | 361/699 |
| 11,956,925 B2 * | 4/2024 | Tung | ................. | H05K 7/20318 |
| 12,156,377 B2 * | 11/2024 | Tan | .................... | H05K 7/20318 |
| 12,342,502 B2 * | 6/2025 | Lau | ................... | H05K 7/20818 |
| 2023/0171923 A1 * | 6/2023 | Lau | ................... | H05K 7/20327 |
| | | | | 165/274 |
| 2025/0063692 A1 * | 2/2025 | Li | ......................... | H05K 7/203 |

OTHER PUBLICATIONS

Extended European search report received in European Application No. 25162243.7, mailed on Jun. 16, 2025, 6 pages.
Communication pursuant to Rules 70(2) and 70a (2) received in European Application No. 25162243.7, mailed on Jul. 21, 2025, 2 Pages.
Communication under Rule 71(3) Received in European Patent Application No. 22720176.1, mailed on Jun. 16, 2025, 08 pages.

* cited by examiner

SYSTEMS AND METHODS FOR IMMERSION-COOLED DATACENTERS

CROSS-REFERENCE TO RELATED APPLICATIONS

This application is a continuation of U.S. patent application Ser. No. 17/308,739, filed May 5, 2021, which is hereby incorporated by reference in its entirety.

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, a thermal management system for cooling electronic devices includes an immersion cooling system, a vapor buffer tank, and a liquid buffer tank. The immersion cooling system includes an immersion tank, a working fluid, and a condenser. The immersion tank defines an immersion chamber. The working fluid is positioned in the immersion chamber, with a liquid portion of the working fluid defining an immersion bath in the immersion chamber and a vapor portion of the working fluid defining a headspace above the immersion bath in the immersion chamber. The condenser is positioned in fluid communication with the headspace to condense the vapor portion of the working fluid to the liquid portion of the working fluid. The immersion cooling system is in fluid communication with the vapor buffer tank and the liquid buffer tank. The vapor buffer tank is in fluid communication with the headspace of the immersion chamber, and a vapor valve is positioned between the vapor buffer tank and the headspace to selectively allow fluid communication between the vapor buffer tank and the headspace. The liquid buffer tank is in fluid communication with the immersion chamber, and a liquid valve is positioned between the liquid buffer tank and the immersion chamber to selectively allow fluid communication between the liquid buffer tank and the immersion chamber.

In some embodiments, a thermal management system for cooling electronic devices includes a first immersion cooling system, a second immersion cooling system, a vapor buffer tank, and a liquid buffer tank. Each immersion cooling system includes an immersion tank, a working fluid, and a condenser. The immersion tank defines an immersion chamber. The working fluid is positioned in the immersion chamber, with a liquid portion of the working fluid defining an immersion bath in the immersion chamber and a vapor portion of the working fluid defining a headspace above the immersion bath in the immersion chamber. The condenser is positioned in fluid communication with the headspace to condense the vapor portion of the working fluid to the liquid portion of the working fluid. The immersion cooling system is in fluid communication with the vapor buffer tank and the liquid buffer tank. The vapor buffer tank is in fluid communication with the headspace of the immersion chamber of the first immersion cooling system, and a first vapor valve is positioned between the vapor buffer tank and the headspace to selectively allow fluid communication between the vapor buffer tank and the headspace. The vapor buffer tank is in fluid communication with the headspace of the immersion chamber of the second immersion cooling system, and a second vapor valve is positioned between the vapor buffer tank and the headspace to selectively allow fluid communication between the vapor buffer tank and the headspace. The liquid buffer tank is in fluid communication with the immersion chamber of the first immersion cooling system, and a first liquid valve is positioned between the liquid buffer tank and the immersion chamber to selectively allow fluid communication between the liquid buffer tank and the immersion chamber. The liquid buffer tank is in fluid communication with the immersion chamber of the second immersion cooling system, and a second liquid valve is positioned between the liquid buffer tank and the immersion chamber to selectively allow fluid communication between the liquid buffer tank and the immersion chamber.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the working fluid vaporizes, introducing vapor into the liquid of the working fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion tank and a condenser to extract heat from the vapor of the working fluid. The condenser then condenses the vapor phase of the working fluid into a liquid phase and returns the liquid working fluid to the immersion chamber of the immersion tank. In some embodiments, the liquid working fluid absorbs heat from the heat-generating components, and one or more fluid conduits direct the hot liquid working fluid outside of the immersion chamber to a radiator or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system. An ambient liquid has a greater rate of convective transfer compared to an ambient gas, and therefore an immersion cooling system submerged in an ambient liquid may exhaust heat from the immersion cooling system more efficiently and/or without active cooling such as fans or pumps to move the ambient fluid over the immersion cooling system heat exchanger or heat-dispersing elements. In at least one embodiment, an immersion cooling system is submerged underwater, and heat is removed from the heat-generating components by the working fluid before the heat is transferred from the working fluid to the ambient water outside of the immersion cooling system.

Figure 1:
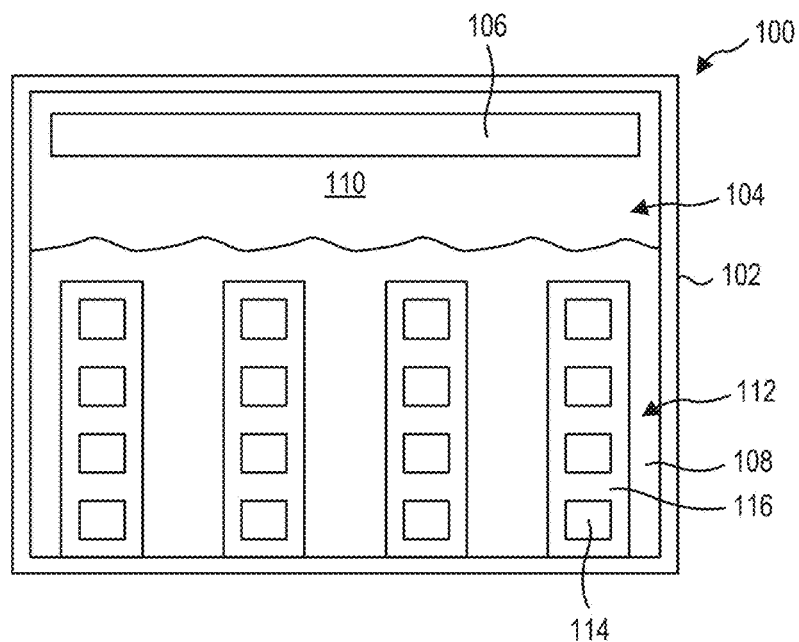
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
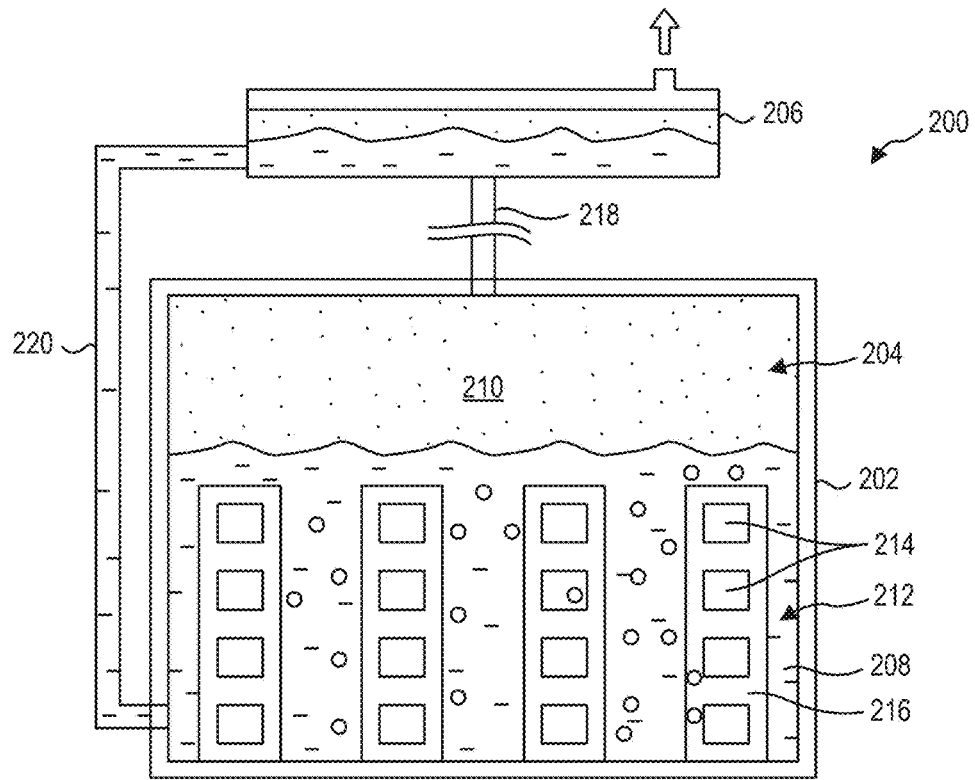
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

Figure 3:
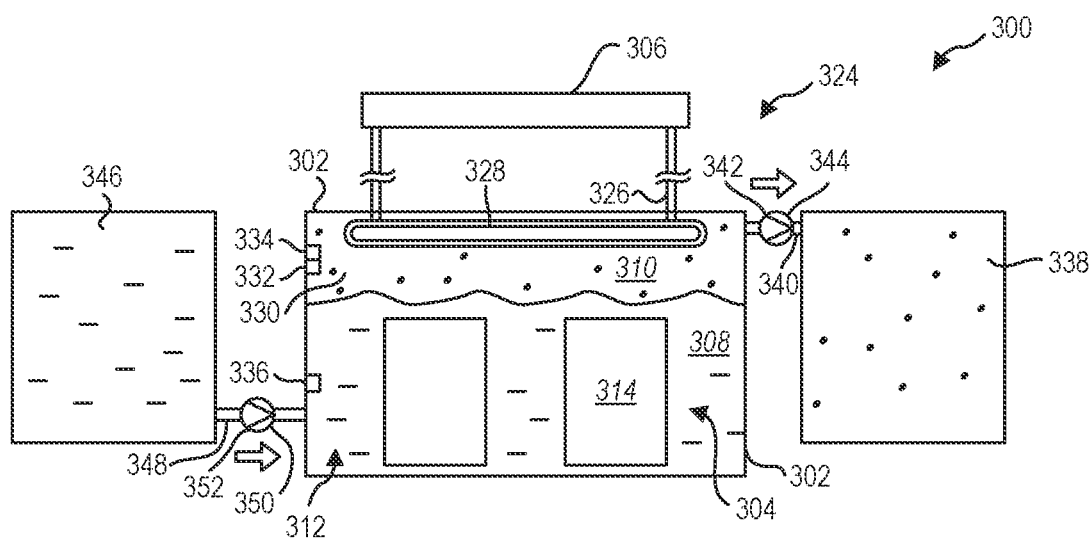
FIG. 3 is a schematic cross-sectional view of a two-phase immersion cooling system with buffer tanks, according to at least one embodiment of the present disclosure.

Referring now to FIG. 3, in some embodiments, an immersion cooling system 300 has an immersion chamber 304 that is hermetically sealed to prevent leakage of the working fluid to the surrounding environment. In some embodiments, the immersion tank 302 is a housing for an information technology (IT) Module 324 that is intended and/or designed to fail-in-place. A fail-in-place IT Module is intended and/or designed to remain in place for a predetermined period of time, whether the devices in or connected to the IT Module continue to operate for the full period or whether one or more devices fail during the period. The IT Module 324 may be only intended and/or designed to be recovered at the end of the predetermined period.

In some embodiments, the immersion chamber 304 is hermetically sealed and intended and/or designed to operate for a predetermined period. Repairs may be performed to the device(s) in or connected to the IT Module 324, but the hermetic seal on the immersion chamber 304 may slow the repair or maintenance process. In the event of a condenser or other cooler failure, an immersion cooling system 300 according to the present disclosure may provide flow of working fluid into or out of the immersion chamber 304 to prevent over-heating or over-pressurizing of the immersion chamber 304 and/or prevent liquid working fluid levels from dropping below a predetermined level in the immersion chamber, which could otherwise result in damage to the heat-generating components 314 contained therein.

In some embodiments, a condenser 306 cools the vapor working fluid in the immersion chamber 304 using a circulating cooling fluid 326 from coils 328 to the condenser 306 to absorb and exhaust waste heat from the immersion chamber 304. In some embodiments, a cold plate, a Peltier cooler, or other cooling surface cools the vapor working fluid in the immersion chamber. The two-phase immersion cooling system absorbs heat from the heat-generating components 314 in the liquid working fluid 308, which boils the liquid working fluid 308. The vapor working fluid 310 carries the heat to the condenser 306 or other cooling surface, which cools the vapor working fluid 310.

In the event of a condenser 306 or cooling surface failure, the vapor working fluid 310 may have no efficient heat sink in the headspace 330 of the immersion chamber 304, limiting the condensation of the vapor working fluid 310. A condenser failure, therefore, can result in a reduction in cooling capacity through an increase in temperature in the immersion chamber 304 and through a reduction in liquid working fluid level in the immersion chamber 304. Further, without condensation of the vapor working fluid 310, a hermetically sealed immersion chamber 304 will experience an increase in internal pressure. An increase in pressure will produce an increase in the boiling temperature of the working fluid, which may result in the liquid working fluid increasing in temperature above the normal boiling point and exposing the heat-generating components 314 to elevated temperatures, even when in contact with liquid working fluid 308.

Immersion cooling systems, according to some embodiments of the present disclosure, include at least one environmental sensor measure an environmental condition of the immersion chamber. Environmental conditions in the immersion chamber may include a vapor temperature, a liquid temperature, an internal pressure, a liquid working fluid level, or other properties relating to the state of the working fluid in the immersion chamber.

For example, an environmental sensor may be a temperature sensor 332 positioned in the headspace 330 of the immersion chamber 304 to measure a vapor temperature of the immersion chamber 304. In some examples, an environmental sensor may be a temperature sensor 332 positioned in the immersion bath 312 of the immersion chamber 304 to measure a liquid temperature of the liquid working fluid 308 in the immersion chamber 304. In some examples, an environmental sensor may be a pressure sensor 334 positioned in the immersion chamber 304 to measure an internal pressure of the immersion chamber 304. While a pressure sensor at a bottom of the immersion chamber may read differently than a pressure sensor 334 in the headspace of the immersion chamber 304, both will report equal increases in the event of a pressure increase in the immersion chamber 304.

In some examples, an environmental sensor may be a liquid level sensor 336 positioned in the immersion chamber to measure a liquid working fluid level of the immersion chamber. The liquid level sensor 336 may be a liquid contact switch positioned below the surface level of the liquid working fluid 308. For example, when submerged in the liquid working fluid 308, the liquid contact switch 336 may be closed, and, when the liquid working fluid level drops due to vaporization of the liquid working fluid 308, the contact switch is exposed to the vapor working fluid 310 above the liquid working fluid 308, opening the switch. In other examples, the liquid level sensor 336 may be an optical sensor that detects a light reflect and/or refracted by the liquid working fluid 308. In some examples, the liquid level sensor 336 is a pressure sensor that measures a mass of the liquid working fluid 308 present in the immersion chamber 304 above the liquid level sensor 336. In some examples, the liquid level sensor 336 is a float sensor that measures a height of the liquid level sensor 336.

In some embodiments, the immersion cooling system includes a plurality of environmental sensors. For example, a vapor temperature sensor may detect and increase in vapor working fluid temperature (and hence a condenser failure) before an appreciable increase in liquid working fluid temperature is detected. In some embodiments, a liquid level sensor measures changes in liquid level independently from temperature changes, in the event that vapor working fluid is vented from the immersion chamber.

In the event of a condenser failure, the working fluid in the immersion chamber may continue to boil, increasing the temperature and pressure of the vapor working fluid in the headspace of the immersion chamber. A portion of the vapor working fluid 310 may be safely vented from the headspace 330 into a vapor buffer tank 338 to reduce the pressure in the headspace 330. In some embodiments, reducing the pressure in the headspace 330 also cools the remaining vapor working fluid 310 in the headspace 330.

The vapor buffer tank 338 is connected to the immersion chamber 304 through a vapor conduit 340. In some embodiments, the vapor conduit 340 includes a valve 342 that allows flow of vapor working fluid from the high pressure in the immersion chamber to the vapor buffer tank. The vapor working fluid 310 will flow to the region of lower pressure. In some embodiments, the vapor conduit includes a vapor pump 344 to urge (e.g., pump) vapor working fluid 310 from the immersion chamber 304 into the vapor buffer tank 338. A pump may allow the vapor buffer tank to continue increasing in pressure above the pressure of the immersion chamber. The vapor conduit is in fluid communication with the headspace of the immersion chamber. In some embodiments, the vapor conduit 340 is connected to a top surface of the immersion tank 302. In some embodiments, the vapor conduit 340 is connected to an upper portion of a sidewall of the immersion tank 302 above the liquid working fluid level.

In some embodiments, the immersion cooling system 300 further includes a liquid buffer tank 346. The liquid buffer tank 346 is a separate tank in fluid communication with the immersion chamber 304 by a liquid conduit 348. In some embodiments, the liquid conduit 348 includes a liquid valve 350 that allows flow of liquid working fluid 308 between the liquid buffer tank 346 and the immersion chamber 304. For example, if a level of the liquid buffer tank 346 is higher than the liquid working fluid level in the immersion chamber 304, the liquid working fluid 308 will flow into the immersion chamber 304. In some embodiments, at least a portion of the liquid buffer tank 346 is positioned higher than the immersion tank 302 of the immersion cooling system 300. In some embodiments, the bottom of the liquid buffer tank 346 is positioned higher than the top of the immersion tank 302 of the immersion cooling system 300. In some embodiments, the bottom of the liquid buffer tank 346 is positioned at or near the top of the heat-generating components 314 in the immersion tank 302 of the immersion cooling system 300.

In some embodiments, the liquid conduit 348 includes a liquid pump 352 to urge liquid working fluid 308 from the liquid buffer tank 346 to the immersion chamber 304. A liquid pump 352 may allow the liquid buffer tank 346 to continue delivering supplemental liquid working fluid 308 to the immersion chamber 304, irrespective of the relative heights of the liquid levels in each tank.

In some embodiments, the valves and/or pumps of the vapor conduit 340 and the liquid conduit 348 are controlled and/or actuated at the same time. In some embodiments, the valves and/or pumps of the vapor conduit 340 and the liquid conduit 348 are controlled and/or actuated based on different environmental sensors or other sensors. For example, a vapor pump 342 may be actuated based on a measurement from a temperature sensor 332 positioned in the headspace 330 to measure the vapor temperature, and the liquid pump 352 may be actuated based on a measurement from a liquid level sensor 336.

In some embodiments, in addition to the environmental sensor(s) positioned in or on the immersion tank, an immersion cooling system includes one or more flow sensors positioned in or on the vapor conduit and/or the liquid conduit. The flow sensors can measure the rate and/or total amount of vapor working fluid and/or liquid working fluid that moves out of and/or into the immersion chamber. For example, a vapor flow rate sensor on the vapor conduit may measure the total vapor working fluid vented from the immersion chamber, and a liquid flow rate sensor may measure the total amount of liquid working fluid introduced to the immersion chamber. In some embodiments, the mass of the liquid working fluid introduced by the liquid pump or through the liquid valve is related to the measured mass of vapor released from the immersion chamber.

A liquid valve controller may be in electrical communication with the liquid valve and/or pump and with at least one sensor. The liquid valve controller receives measurements from the sensor to determine when to open the liquid valve and/or actuate the liquid pump. It should be understood that the liquid valve controller, as used herein, selectively controls the flow of liquid working fluid through the liquid conduit, irrespective of whether the liquid valve controller controls a valve, pump, or other mechanisms. A vapor valve controller may be in electrical communication with the vapor valve and/or pump and with at least one sensor. The vapor valve controller receives measurements from the sensor to determine when to open the vapor valve and/or actuate the vapor pump. It should be understood that the vapor valve controller, as used herein, selectively controls the flow of vapor working fluid through the vapor conduit, irrespective of whether the vapor valve controller controls a valve, pump, or other mechanisms.

The vapor buffer tank 338 allows the high pressure and/or high temperature vapor working fluid 310 to exit the immersion chamber 304 (without venting to atmosphere), which, in turn, allows the liquid working fluid 308 in the immersion chamber 304 to boil at the expected temperature and maintain cooling for the heat-generating components 314, in the event of a condenser failure. If technicians are unable to repair or restart the condenser 306 in the immersion chamber 304 before the liquid working fluid level falls below a threshold level, the liquid buffer tank 346 can provide supplemental liquid working fluid 308 into the immersion chamber 304 to raise the liquid working fluid level and cool the immersion chamber 304.

Figure 4:
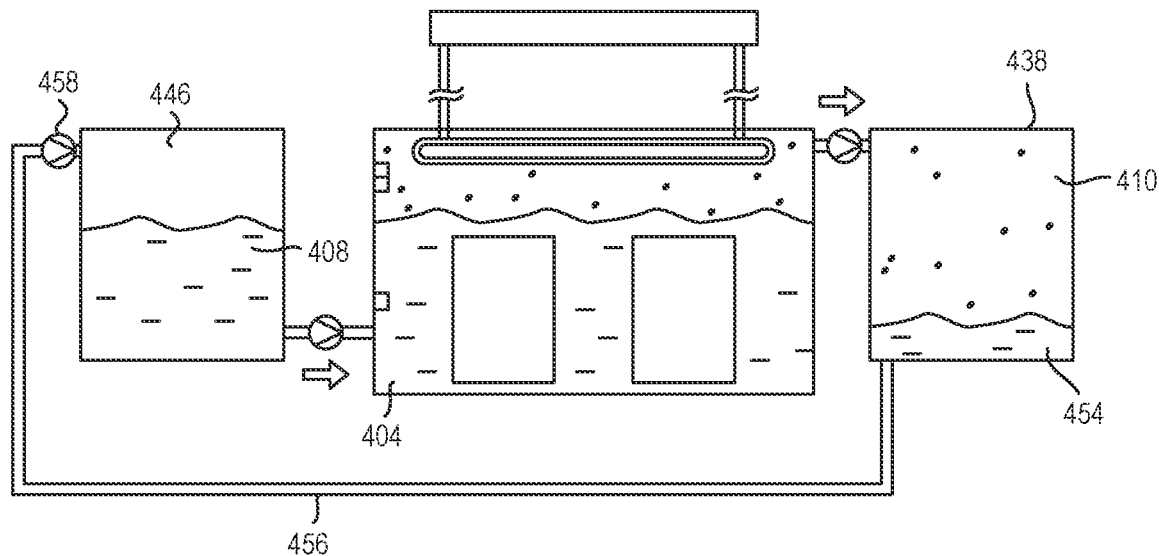
FIG. 4 is a schematic cross-sectional view of a two-phase immersion cooling system with recirculating buffer tanks, according to at least one embodiment of the present disclosure.

Referring now to FIG. 4, in some embodiments, a vapor buffer tank 438 may allow for at least a portion of the excess vapor working fluid 410 to condense into a condensate 454. In some embodiments, the vapor buffer tank 438 includes a condenser or other cooling surface. In some embodiments, the vapor buffer tank 438 is allowed to remain at ambient temperature, which may be sufficient to condense the vapor working fluid 410 to the condensate 454. The condensate 454 may be returned to the liquid buffer tank 446 by a return conduit 456. In some embodiments, a return pump 458 is positioned in the return conduit 454 to urge the condensate 454 through the return conduit 456 into the liquid buffer tank 446. The condensate 454 may at least partially refill the liquid buffer tank 446, allowing further supplemental liquid working fluid 408 to be available, if needed, to maintain the liquid working fluid level in the immersion chamber 404.

Figure 5:
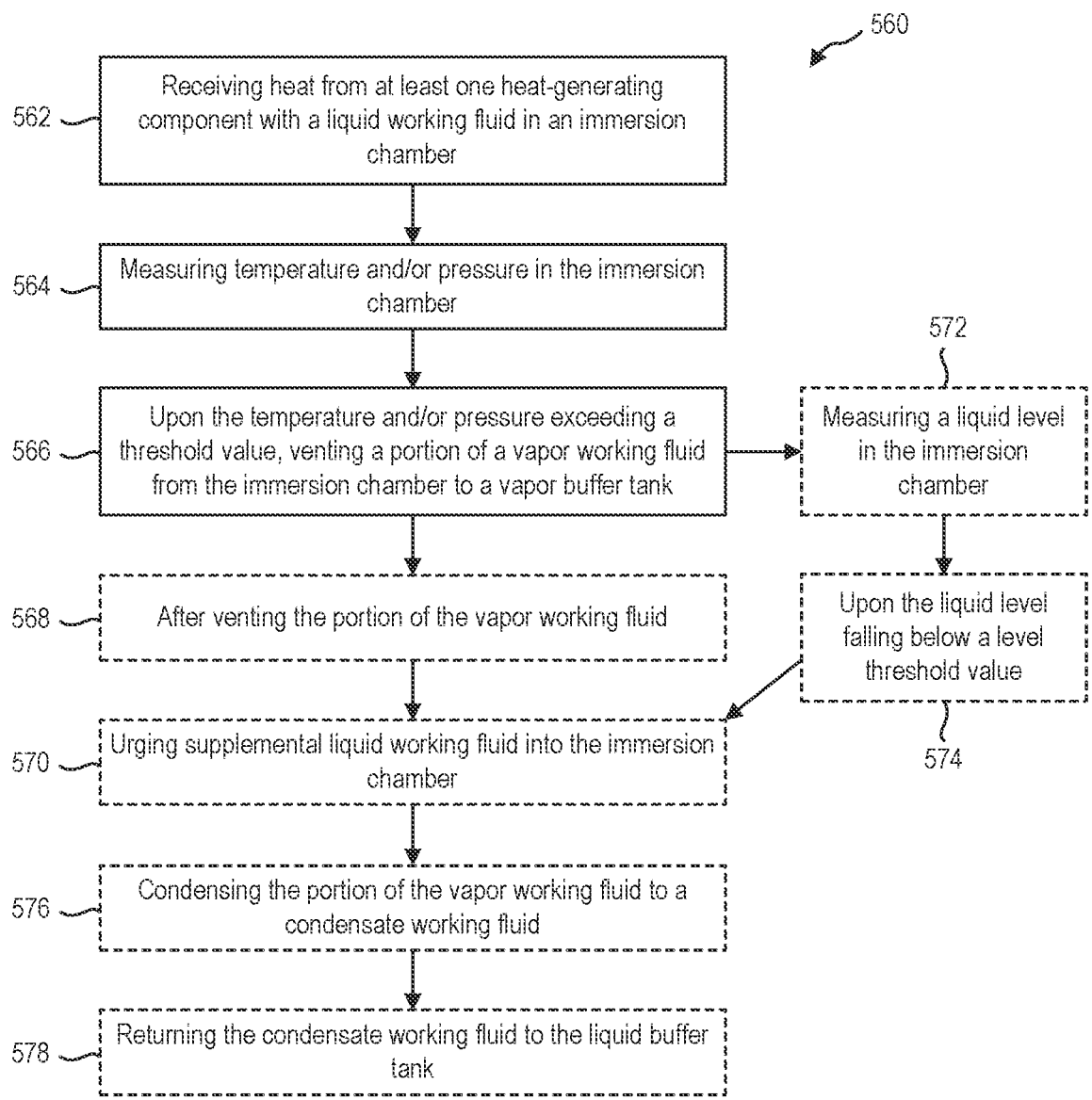
FIG. 5 is a flowchart illustrating a method of working fluid controls in a two-phase immersion cooling system, according to at least one embodiment of the present disclosure.

FIG. 5 is a flowchart illustrating a method 560 of thermal management with immersion cooling. In some embodiments, a method 560 of thermal management according to the present disclosure includes at least partially surrounding heat-generating components with a liquid working fluid in an immersion chamber to receive heat from the heat-generating component at 562. The method includes measuring at least the temperature and/or pressure in the immersion chamber at 564. Upon the temperature and/or pressure exceeding a threshold value, the method includes venting a portion of the vapor working fluid from the immersion chamber to a vapor buffer tank at 566, using any of the sensors, valves, or pumps as described herein.

The threshold values may be set based on a percentage of the steady-state operating conditions. In some embodiments, the threshold value for the vapor temperature of the vapor working fluid in the headspace may be 5% above the boiling temperature in Celsius. For example, if the boiling temperature is 60° C., the threshold value may be 63° C. In some embodiments, the threshold value may be a nominal amount above the steady state operating condition, such as a 5 pound per square inch (psi) increase in the pressure in the immersion chamber.

In some embodiments, the method includes venting the portion of the vapor working fluid from the immersion chamber before opening a liquid valve and/or actuating a liquid pump to introduce supplemental liquid working fluid to the immersion chamber at 570. The liquid valve may be opened and/or the liquid pump may be actuated at a predetermined time interval after the vapor working fluid is vented from the immersion chamber at 568. For example, an internal pressure of the immersion chamber will decrease upon venting the pressurized vapor working fluid from the headspace to the vapor buffer tank. In some embodiments, the immersion cooling system may open the liquid valve and/or actuate the liquid pump after 5 seconds, 10 seconds, 15 second, 20 seconds, 30 seconds, 1 minutes, or another predetermined time interval to allow the immersion chamber to depressurize before introducing supplemental liquid working fluid into the immersion chamber.

In some embodiments, the liquid valve may be opened and/or the liquid pump may be actuated after the vapor working fluid is vented based on a liquid level sensor measurement or a pressure measurement at 572. In some embodiments, the liquid valve may be opened and/or the liquid pump may be actuated any time the liquid level falls below a threshold level to maintain the liquid working fluid level at 574, such as in the event of a leak from the immersion tank. In some embodiments, the liquid valve may be opened and/or the liquid pump may be actuated only after vapor working fluid is vented from the immersion chamber. At which point, the liquid valve may be opened and/or the liquid pump may be actuated if the liquid working fluid level falls below a threshold level to maintain the liquid working fluid level.

In a particular example, the pressure sensor may be in communication with the vapor valve controller and the liquid valve controller. When an internal pressure of the immersion chamber exceeds a vent threshold value, the vapor valve controller may open the vapor valve and/or actuate the vapor pump to vent the vapor working fluid from the immersion chamber and lower the internal pressure in the immersion chamber. After the vapor is vented, and the pressure decreases below a fill threshold value, the liquid valve controller may open the liquid valve and/or actuate the liquid pump to introduce the supplemental liquid working fluid into the immersion chamber from the liquid buffer tank. By only opening the liquid valve and/or actuating the liquid pump after the pressure has dropped, the supplemental liquid working fluid will not experience the elevated internal pressure of the immersion chamber applying a force to the supplemental liquid working fluid that resists the flow of the supplemental liquid working fluid into the immersion chamber from the liquid buffer tank.

In some embodiments, in addition to the environmental sensor(s) positioned in or on the immersion tank, an immersion cooling system includes one or more flow sensors positioned in or on the vapor conduit and/or the liquid conduit. The flow sensors can measure the rate and/or total amount of vapor working fluid and/or liquid working fluid that moves out of and/or into the immersion chamber. For example, a flow rate of the vapor working fluid through the vapor conduit may be converted to a flow rate of the liquid working fluid through the liquid conduit based on a relative density of the vapor phase to the liquid phase of the working fluid to ensure the mass of working fluid in the immersion chamber remains substantially constant as vapor working fluid is vented and supplemental liquid working fluid is introduced.

Optionally, the method includes condensing at least some of the vented portion of the vapor working fluid in the vapor buffer tank to a condensate working fluid at 576 and returning the condensate working fluid to the liquid buffer tank at 578. In some embodiments, the vapor buffer tank may include a condenser or other cooling surface to assist condensing the vapor working fluid. In some embodiments, at least some of the vapor working fluid will condense in the vapor buffer tank in the absence of heat-generating components.

Figure 6:
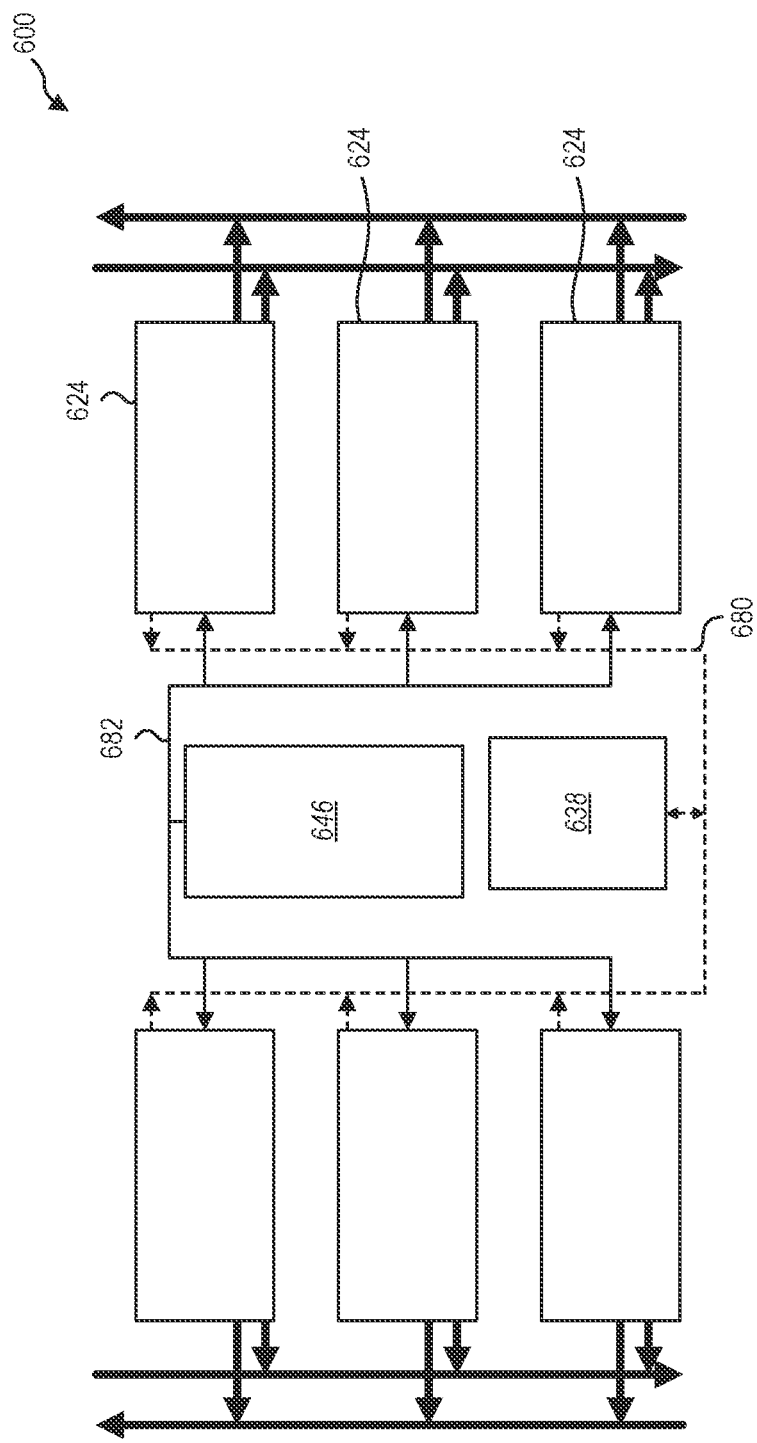
FIG. 6 is a schematic cross-sectional view of parallel two-phase immersion cooling systems with buffer tanks, according to at least one embodiment of the present disclosure.

In some embodiments, such as that shown in FIG. 6, a vapor buffer tank 638 and/or liquid buffer tank 646 are connected to a plurality of sealed IT modules 624. An immersion cooling system 600 can include a plurality of sealed IT Modules 624 connected in parallel with a vapor buffer tank 638 and/or liquid buffer tank 646. In some embodiments, each of the parallel IT Modules 624 has a vapor valve and/or vapor pump (such as the vapor conduit 340 described in relation to FIG. 3) positioned in or on a vapor conduit to selectively connect the IT Module 624 to a vapor common conduit 680 that combines vapor working fluid from more than one IT Module 624. In some embodiments, each of the parallel IT Modules 624 has a dedicated vapor conduit that connects the individual IT Module 624 to the vapor buffer tank 638.

In some embodiments, each of the parallel IT Modules 624 has a liquid valve and/or liquid pump positioned in or on a liquid conduit (such as the liquid conduit 348 described in relation to FIG. 3) to selectively connect the IT Module 624 to a liquid common conduit 682 that provides supplemental liquid working fluid to more than one IT Module 624. In some embodiments, each of the parallel IT Modules 624 has a dedicated liquid conduit that connects the individual IT Module 624 to the liquid buffer tank 646.

In the event of a failure of any of the condensers in each of the IT Modules, the immersion cooling system 600 can vent vapor working fluid from the IT Module experiencing the failure to the vapor buffer tank 638. The immersion cooling system can then direct supplemental working fluid from the shared liquid buffer tank 646 to the IT Module 624 needing it.

INDUSTRIAL APPLICABILITY

The present disclosure relates generally to systems and methods for thermal management of electronic devices or other heat-generating components. Immersion chambers surround or partially surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid.

The vapor will rise due to buoyancy in the opposite direction of gravity, accumulating in a headspace of the immersion chamber above the immersion bath of liquid working fluid.

An immersion cooling system according to the present disclosure includes an immersion chamber with a working fluid positioned therein. The working fluid transitions between a liquid phase and a vapor phase to remove heat from hot or heat-generating components in the chamber. The liquid phase more efficiency receives heat from the components and, upon transition to the vapor phase, the working fluid can be cooled and condensed to extract the heat from the working fluid before the working fluid is returned to the liquid immersion bath at a lower temperature.

In some embodiments, the immersion bath of the liquid working fluid has a plurality of heat-generating components positioned in the liquid working fluid. The liquid working fluid surrounds the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the working fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor rises in the liquid working fluid, the vapor phase of the working fluid accumulates in an upper vapor region of the chamber. Conventionally, a condenser cools part of the vapor of the working fluid back into a liquid phase, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

In some embodiments, the immersion chamber is hermetically sealed to prevent leakage of the working fluid to the surrounding environment. In some embodiments, the immersion chamber is a housing for an information technology (IT) Module that is intended and/or designed to fail-in-place. A fail-in-place IT Module is intended and/or designed to remain in place for a predetermined period of time, whether the devices in or connected to the IT Module continue to operate for the full period or whether one or more devices fail during the period. The IT Module is only intended and/or designed to be recovered at the end of the predetermined period.

In some embodiments, the immersion chamber is hermetically sealed and intended and/or designed to operate for a predetermined period. Repairs may be performed to the device(s) in or connected to the IT Module, but the hermetic seal on the immersion chamber may slow the repair or maintenance process. In the event of a condenser or other cooler failure, an immersion cooling system according to the present disclosure may provide supplemental flow of working fluid into or out of the immersion chamber to prevent over-heating or over-pressurizing of the immersion chamber and/or prevent liquid working fluid levels from dropping below a predetermined level in the immersion chamber.

In some embodiments, a condenser cools the vapor working fluid in the immersion chamber using a circulating cooling fluid in the condenser to absorb and exhaust waste heat from the immersion chamber. In some embodiments, a cold plate, a Peltier cooler, or other cooling surface cools the vapor working fluid in the immersion chamber. The two-phase immersion cooling system absorbs heat from the heat-generating components in the liquid working fluid, which boils the liquid working fluid. The vapor working fluid carries the heat to the condenser or other cooling surface, which cools the vapor working fluid.

In the event of a condenser or cooling surface failure, the vapor may have no efficient heat sink in the headspace of the immersion chamber, limiting the condensation of the vapor working fluid. A condenser failure, therefore, can result in a reduction in cooling capacity through an increase in temperature in the immersion chamber and through a reduction in liquid working fluid level in the immersion chamber. Further, without condensation of the vapor working fluid, a hermetically sealed immersion chamber will experience an increase in internal pressure. An increase in pressure will produce an increase in the boiling temperature of the working fluid, which may result in the liquid working fluid increasing in temperature above the normal boiling point and exposing the heat-generating components to elevated temperatures, even in the presence of liquid working fluid.

Immersion cooling systems, according to some embodiments of the present disclosure, include at least one environmental sensor measure an environmental condition of the immersion chamber. Environmental conditions in the immersion chamber may include a vapor temperature, a liquid temperature, an internal pressure, a liquid working fluid level, or other properties relating to the state of the working fluid in the immersion chamber.

For example, an environmental sensor may be a temperature sensor positioned in the headspace of the immersion chamber to measure a vapor temperature of the immersion chamber. In some examples, an environmental sensor may be a temperature sensor positioned in the immersion bath of the immersion chamber to measure a liquid temperature of the liquid working fluid in the immersion chamber. In some examples, an environmental sensor may be a pressure sensor positioned in the immersion chamber to measure an internal pressure of the immersion chamber. While a pressure sensor at a bottom of the immersion chamber may read differently than a pressure sensor in the headspace of the immersion chamber, both will report equal increases in the event of a pressure increase in the immersion chamber.

In some examples, an environmental sensor may be a liquid level sensor positioned in the immersion chamber to measure a liquid working fluid level of the immersion chamber. The liquid level sensor may be a liquid contact switch positioned below the surface level of the liquid working fluid. For example, when submerged in the liquid working fluid, the liquid contact switch may be closed, and, when the liquid working fluid level drops due to vaporization of the liquid working fluid, the contact switch is exposed to the vapor working fluid above the liquid working fluid, opening the switch. In other examples, the liquid level sensor may be an optical sensor that detects a light reflect and/or refracted by the liquid working fluid. In some examples, the liquid level sensor is a pressure sensor that measures a mass of the liquid working fluid present in the immersion chamber above the liquid level sensor. In some examples, the liquid level sensor is a float sensor that measures a height of the liquid level sensor.

In some embodiments, the immersion cooling system includes a plurality of environmental sensors. For example, a vapor temperature sensor may detect and increase in vapor working fluid temperature (and hence a condenser failure) before an appreciable increase in liquid working fluid temperature is detected. In some embodiments, a liquid level sensor measures changes in liquid level independently from temperature changes, in the event that vapor working fluid is vented from the immersion chamber.

In the event of a condenser failure, the working fluid in the immersion chamber may continue to boil, increasing the temperature and pressure of the vapor working fluid in the headspace of the immersion chamber. A portion of the vapor working fluid may be safely vented from the headspace into vapor buffer tank to reduce the pressure in the headspace. In some embodiments, reducing the pressure in the headspace also cools the remaining vapor working fluid in the headspace.

The vapor buffer tank is connected to the immersion chamber through a vapor conduit. In some embodiments, the vapor conduit includes a valve that allows flow of vapor working fluid from the high pressure in the immersion chamber to the vapor buffer tank. The vapor working fluid will flow to the region of lower pressure. In some embodiments, the vapor conduit includes a pump to urge vapor working fluid from the immersion chamber into the vapor buffer tank. A pump may allow the vapor buffer tank to continue increasing in pressure above the pressure of the immersion chamber. The vapor conduit is in fluid communication with the headspace of the immersion chamber. In some embodiments, the vapor conduit is connected to a top surface of the immersion tank. In some embodiments, the vapor conduit is connected to an upper portion of a sidewall above the liquid working fluid level.

In some embodiments, the immersion cooling system further includes a liquid buffer tank. The liquid buffer tank is a separate tank in fluid communication with the immersion chamber by a liquid conduit. In some embodiments, the liquid conduit includes a valve that allows flow of liquid working fluid between the liquid buffer tank and the immersion chamber. For example, if a level of the liquid buffer tank is higher than the liquid working fluid level in the immersion chamber, the liquid working fluid will flow into the immersion chamber. In some embodiments, at least a portion of the liquid buffer tank is positioned higher than the immersion tank of the immersion cooling system. In some embodiments, the bottom of the liquid buffer tank is positioned higher than the top of the immersion tank of the immersion cooling system. In some embodiments, the bottom of the liquid buffer tank is positioned at or near the top of the heat-generating components in the immersion tank of the immersion cooling system.

In some embodiments, the liquid conduit includes a pump to urge liquid working fluid from the liquid buffer tank to the immersion chamber. A pump may allow the liquid buffer tank to continue delivering extra liquid working fluid to the immersion chamber, irrespective of the relative heights of the liquid levels in each tank.

In some embodiments, the valves and/or pumps of the vapor conduit and the liquid conduit are controlled and/or actuated at the same time. In some embodiments, the valves and/or pumps of the vapor conduit and the liquid conduit are controlled and/or actuated based on different environmental sensors or other sensors. For example, a vapor pump may be actuated based on a measurement from a temperature sensor positioned in the headspace to measure the vapor temperature, and the liquid pump may be actuated based on a measurement from a liquid level sensor.

In some embodiments, in addition to the environmental sensor(s) positioned in or on the immersion tank, an immersion cooling system includes one or more flow sensors positioned in or on the vapor conduit and/or the liquid conduit. The flow sensors can measure the rate and/or total amount of vapor working fluid and/or liquid working fluid that moves out of and/or into the immersion chamber. For example, a vapor flow rate sensor on the vapor conduit may measure the total vapor working fluid vented from the immersion chamber, and a liquid flow rate sensor may measure the total amount of liquid working fluid introduced to the immersion chamber. In some embodiments, the mass of the liquid working fluid introduced by the liquid pump or through the liquid valve is related to the measured mass of vapor released from the immersion chamber.

A liquid valve controller may be in electrical communication with the liquid valve and/or pump and with at least one sensor. The liquid valve controller receives measurements from the sensor to determine when to open the liquid valve and/or actuate the liquid pump. It should be understood that the liquid valve controller, as used herein, selectively controls the flow of liquid working fluid through the liquid conduit, irrespective of whether the liquid valve controller controls a valve, pump, or other mechanisms. A vapor valve controller may be in electrical communication with the vapor valve and/or pump and with at least one sensor. The vapor valve controller receives measurements from the sensor to determine when to open the vapor valve and/or actuate the vapor pump. It should be understood that the vapor valve controller, as used herein, selectively controls the flow of vapor working fluid through the vapor conduit, irrespective of whether the vapor valve controller controls a valve, pump, or other mechanisms.

The vapor buffer tank allows the high pressure and/or high temperature vapor working fluid to exit the immersion chamber (without venting to atmosphere), which, in turn, allows the liquid working fluid in the immersion chamber to boil at the expected temperature and maintain cooling for the heat-generating components, in the event of a condenser failure. If technicians are unable to repair or restart the condenser in the immersion chamber before the liquid working fluid level falls below a threshold level, the liquid buffer tank can provide supplemental liquid working fluid into the immersion chamber to raise the liquid working fluid level and cool the immersion chamber.

In some embodiments, the vapor buffer tank may allow for at least a portion of the excess vapor working fluid to condense into a condensate. In some embodiments, the vapor buffer tank includes a condenser or other cooling surface. In some embodiments, the vapor buffer tank is allowed to remain at ambient temperature, which may be sufficient to condense the vapor working fluid to the condensate. The condensate may be returned to the liquid buffer tank by a return conduit. In some embodiments, a return pump is positioned in the return conduit to urge the condensate through the return conduit into the liquid buffer tank. The condensate may at least partially refill the liquid buffer tank, allowing further supplemental liquid working fluid to be available, if needed, to maintain the liquid working fluid level in the immersion chamber.

In some embodiments, a method of thermal management according to the present disclosure includes at least partially surrounding heat-generating components with a liquid working fluid in an immersion chamber to receive heat from the heat-generating component. The method includes measuring at least the temperature and/or pressure in the immersion chamber. Upon the temperature and/or pressure exceeding a threshold value, the method includes venting a portion of the vapor working fluid from the immersion chamber to a vapor buffer tank.

The threshold values may be set based on a percentage of the steady-state operating conditions. In some embodiments, the threshold value for the vapor temperature of the vapor working fluid in the headspace may be 5% above the boiling temperature in Celsius. For example, if the boiling temperature is 60° C., the threshold value may be 63° C. In some embodiments, the threshold value may be a nominal amount above the steady state operating condition, such as a 5 pound per square inch (psi) increase in the pressure in the immersion chamber.

In some embodiments, the method includes venting the portion of the vapor working fluid from the immersion chamber before opening a liquid valve and/or actuating a liquid pump to introduce supplemental liquid working fluid to the immersion chamber. The liquid valve may be opened and/or the liquid pump may be actuated at a predetermined time interval after the vapor working fluid is vented from the immersion chamber. For example, an internal pressure of the immersion chamber will decrease upon venting the pressurized vapor working fluid from the headspace to the vapor buffer tank. In some embodiments, the immersion cooling system may open the liquid valve and/or actuate the liquid pump after 5 seconds, 10 seconds, 15 second, 20 seconds, 30 seconds, 1 minutes, or another predetermined time interval to allow the immersion chamber to depressurize before introducing supplemental liquid working fluid into the immersion chamber.

In some embodiments, the liquid valve may be opened and/or the liquid pump may be actuated after the vapor working fluid is vented based on a liquid level sensor measurement or a pressure measurement. In some embodiments, the liquid valve may be opened and/or the liquid pump may be actuated any time the liquid level falls below a threshold level to maintain the liquid working fluid level, such as in the event of a leak from the immersion tank. In some embodiments, the liquid valve may be opened and/or the liquid pump may be actuated only after vapor working fluid is vented from the immersion chamber. At which point, the liquid valve may be opened and/or the liquid pump may be actuated if the liquid working fluid level falls below a threshold level to maintain the liquid working fluid level.

In a particular example, the pressure sensor may be in communication with the vapor valve controller and the liquid valve controller. When an internal pressure of the immersion chamber exceeds a vent threshold value, the vapor valve controller may open the vapor valve and/or actuate the vapor pump to vent the vapor working fluid from the immersion chamber and lower the internal pressure in the immersion chamber. After the vapor is vented, and the pressure decreases below a fill threshold value, the liquid valve controller may open the liquid valve and/or actuate the liquid pump to introduce the supplemental liquid working fluid into the immersion chamber from the liquid buffer tank. By only opening the liquid valve and/or actuating the liquid pump after the pressure has dropped, the supplemental liquid working fluid will not experience the elevated internal pressure of the immersion chamber applying a force to the supplemental liquid working fluid that resists the flow of the supplemental liquid working fluid into the immersion chamber from the liquid buffer tank.

In some embodiments, in addition to the environmental sensor(s) positioned in or on the immersion tank, an immersion cooling system includes one or more flow sensors positioned in or on the vapor conduit and/or the liquid conduit. The flow sensors can measure the rate and/or total amount of vapor working fluid and/or liquid working fluid that moves out of and/or into the immersion chamber. For example, a flow rate of the vapor working fluid through the vapor conduit may be converted to a flow rate of the liquid working fluid through the liquid conduit based on a relative density of the vapor phase to the liquid phase of the working fluid to ensure the mass of working fluid in the immersion chamber remains substantially constant as vapor working fluid is vented and supplemental liquid working fluid is introduced.

Optionally, the method includes condensing at least some of the vented portion of the vapor working fluid in the vapor buffer tank to a condensate working fluid and returning the condensate working fluid to the liquid buffer tank. In some embodiments, the vapor buffer tank may include a condenser or other cooling surface to assist condensing the vapor working fluid. In some embodiments, at least some of the vapor working fluid will condense in the vapor buffer tank in the absence of heat-generating components.

In some embodiments, a vapor buffer tank and/or liquid buffer tank are connected to a plurality of sealed IT modules. An immersion cooling system can include a plurality of sealed IT Modules connected in parallel with a vapor buffer tank and/or liquid buffer tank. In some embodiments, each of the parallel IT Modules has a vapor valve and/or vapor pump positioned in or on a vapor conduit to selectively connect the IT Module to a vapor common conduit that combines vapor working fluid from more than one IT Module. In some embodiments, each of the parallel IT Modules has a dedicated vapor conduit that connects the individual IT Module to the vapor buffer tank.

In some embodiments, each of the parallel IT Modules has a liquid valve and/or liquid pump positioned in or on a liquid conduit to selectively connect the IT Module to a liquid common conduit that provides supplemental liquid working fluid to more than one IT Module. In some embodiments, each of the parallel IT Modules has a dedicated liquid conduit that connects the individual IT Module to the liquid buffer tank.

In the event of a failure of any of the condensers in each of the IT Modules, the immersion cooling system can vent vapor working fluid from the IT Module experiencing the failure to the vapor buffer tank. The immersion cooling system can then direct supplemental working fluid from the shared liquid buffer tank to the IT Module.

In at least some embodiments of the present disclosure, an immersion cooling system can delay overheating or over-pressurization of the heat-generating components (such as computing components) in the immersion chamber by venting vapor working fluid and introducing supplemental liquid working fluid. By delaying the overheating or over-pressurization, the immersion cooling system can provide technicians with additional time to arrive at and service the IT Module before damage to the heat-generating components can occur.

The present disclosure relates to systems and methods for cooling heat-generating components of a computer or computing device according to at least the examples provided in the sections below:

(A1) In some embodiments, a thermal management system for cooling electronic devices includes an immersion cooling system, a vapor buffer tank, and a liquid buffer tank. The immersion cooling system includes an immersion tank, a working fluid, and a condenser. The immersion tank defines an immersion chamber. The working fluid is positioned in the immersion chamber, with a liquid portion of the working fluid defining an immersion bath in the immersion chamber and a vapor portion of the working fluid defining a headspace above the immersion bath in the immersion chamber. The condenser is positioned in fluid communication with the headspace to condense the vapor portion of the working fluid to the liquid portion of the working fluid. The immersion cooling system is in fluid communication with the vapor buffer tank and the liquid buffer tank. The vapor buffer tank is in fluid communication with the headspace of the immersion chamber, and a vapor valve is positioned between the vapor buffer tank and the headspace to selectively allow fluid communication between the vapor buffer tank and the headspace. The liquid buffer tank is in fluid communication with the immersion chamber, and a liquid valve is positioned between the liquid buffer tank and the immersion chamber to selectively allow fluid communication between the liquid buffer tank and the immersion chamber.

[A2] In some embodiments, the thermal management system described in [A1] further includes a vapor valve controller in electrical communication with the vapor valve and at least one sensor. The vapor valve controller adjusts a state of the vapor valve based at least partially on measurements from the at least one sensor.

[A3] In some embodiments, the sensor described in [A2] is a pressure sensor.

[A4] In some embodiments, the thermal management system described in any of [A1]—[A3] further includes a liquid valve controller in electrical communication with the liquid valve and at least one sensor. The liquid valve controller adjusts a state of the liquid valve based at least partially on measurements from the at least one sensor.

[A5] In some embodiments, the sensor described in [A4] is a liquid level sensor.

[A6] In some embodiments, the thermal management system described in any of [A1]—[A5] further includes a secondary condenser in fluid communication with the vapor buffer tank, which condenses vapor working fluid in the vapor buffer tank to liquid working fluid.

[A7] In some embodiments, the thermal management system described in any of [A1]—[A6] further includes a return conduit connecting the vapor buffer tank to the liquid buffer tank. The return conduit returns condensed liquid working fluid from the vapor buffer tank to the liquid buffer tank.

[A8] In some embodiments, the thermal management system described in any of [A1]—[A7] further includes a vapor pump positioned in the vapor conduit to urge vapor working fluid into the vapor buffer tank.

[A9] In some embodiments, the thermal management system described in any of [A1]—[A8] further includes a liquid pump positioned in the liquid conduit to urge liquid working fluid into the immersion chamber.

[A10] In some embodiments, the thermal management system described in any of [A1]—[A9] further includes at least one flow rate sensor configured to measure mass of working fluid into or out of the immersion chamber.

[B1] In some embodiments, a thermal management system for cooling electronic devices includes a first immersion cooling system, a second immersion cooling system, a vapor buffer tank, and a liquid buffer tank. Each immersion cooling system includes an immersion tank, a working fluid, and a condenser. The immersion tank defines an immersion chamber. The working fluid is positioned in the immersion chamber, with a liquid portion of the working fluid defining an immersion bath in the immersion chamber and a vapor portion of the working fluid defining a headspace above the immersion bath in the immersion chamber. The condenser is positioned in fluid communication with the headspace to condense the vapor portion of the working fluid to the liquid portion of the working fluid. The immersion cooling system is in fluid communication with the vapor buffer tank and the liquid buffer tank. The vapor buffer tank is in fluid communication with the headspace of the immersion chamber of the first immersion cooling system, and a first vapor valve is positioned between the vapor buffer tank and the headspace to selectively allow fluid communication between the vapor buffer tank and the headspace. The vapor buffer tank is in fluid communication with the headspace of the immersion chamber of the second immersion cooling system, and a second vapor valve is positioned between the vapor buffer tank and the headspace to selectively allow fluid communication between the vapor buffer tank and the headspace. The liquid buffer tank is in fluid communication with the immersion chamber of the first immersion cooling system, and a first liquid valve is positioned between the liquid buffer tank and the immersion chamber to selectively allow fluid communication between the liquid buffer tank and the immersion chamber. The liquid buffer tank is in fluid communication with the immersion chamber of the second immersion cooling system, and a second liquid valve is positioned between the liquid buffer tank and the immersion chamber to selectively allow fluid communication between the liquid buffer tank and the immersion chamber.

[B2] In some embodiments, wherein the first immersion chamber and second immersion chamber described in [B1] are in fluid communication with the vapor buffer tank via a vapor common conduit.

[B3] In some embodiments, wherein the first immersion chamber and second immersion chamber described in [B1] or [B3] are in fluid communication with the liquid buffer tank via a liquid common conduit.

[C1] In some embodiments, a method of thermal management includes receiving heat from at least one heat-generating component with a liquid working fluid in an immersion chamber; measuring temperature and/or pressure in the immersion chamber; upon the temperature and/or pressure exceeding a threshold value, venting a portion of a vapor working fluid from the immersion chamber to a vapor buffer tank.

[C2] In some embodiments, the method described in [C1] further includes urging supplemental liquid working fluid into the immersion chamber from a liquid buffer tank.

[C3] In some embodiments, measuring temperature and/or pressure in the immersion chamber as described in [C1] or [C2] further comprises measuring a pressure in the immersion chamber after venting the vapor working fluid. The method then includes urging supplemental liquid working fluid into the immersion chamber from a liquid buffer tank when the pressure falls below a fill threshold value.

[C4] In some embodiments, the method described in [C1] further includes measuring a liquid working fluid level and, when the liquid working fluid level falls below a liquid level threshold value, urging supplemental liquid working fluid into the immersion chamber from a liquid buffer tank.

[C5] In some embodiments, the method described in [C1] further includes, after venting the portion of the vapor working fluid to the vapor buffer tank, urging supplemental liquid working fluid into the immersion chamber from a liquid buffer tank after a predetermine time period.

[C6] In some embodiments, the method described in any of [C1]— [C5] further includes condensing the portion of the vapor working fluid in the vapor buffer tank to a condensate working fluid; and returning the condensate working fluid to a liquid buffer tank.

[C7] In some embodiments, the immersion chamber described in [C1]-[C6] is hermetically sealed.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics.

The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of thermal management of heat-generating components, the method comprising:
   receiving heat from at least one heat-generating component of the heat-generating components with a primary volume of a liquid phase of a working fluid in an immersion chamber;
   measuring one or more of a temperature or a pressure in the immersion chamber;
   upon the one or more of the temperature or the pressure exceeding a threshold value, venting a portion of a vapor phase of the working fluid from the immersion chamber to a vapor buffer tank; and
   selectively flowing, from a supplemental volume of the liquid phase of the working fluid in a liquid buffer tank, a supplemental quantity of the liquid phase of the working fluid to the primary volume of the liquid phase of the working fluid into the immersion chamber, wherein the liquid buffer tank and the vapor buffer tank are in fluid communication only through the immersion chamber.

2. The method of claim 1, wherein the selectively flowing includes selectively pumping, from the supplemental volume of the liquid phase of the working fluid in the liquid buffer tank, the supplemental quantity of the liquid phase of the working fluid into the primary volume of the liquid phase of the working fluid in the immersion chamber.

3. The method of claim 1, wherein the measuring the one or more of the temperature or the pressure in the immersion chamber further comprises measuring the pressure in the immersion chamber after the venting the portion of the vapor phase of the working fluid, and
   the selectively flowing the supplemental quantity of the liquid phase of the working fluid into the immersion chamber from the liquid buffer tank when the pressure falls below a fill pressure of the threshold value.

4. The method of claim 1, further comprising:
   measuring a level of the primary volume of the liquid phase of the working fluid in the immersion chamber, and
   when the level of the primary volume falls below a liquid level threshold value, the selectively flowing by selectively pumping, from the supplemental volume of the liquid phase of the working fluid in the liquid buffer tank, the supplemental quantity of the liquid phase of the working fluid into the primary volume of the liquid phase of the working fluid in the immersion chamber.

5. The method of claim 1, further comprising: after the venting the portion of the vapor phase of the working fluid to the vapor buffer tank, waiting a predetermined time period, and then the selectively flowing the supplemental quantity of the liquid phase of the working fluid into the immersion chamber from the liquid buffer tank.

6. The method of claim 1, further comprising condensing at least some of the portion of the vapor phase of the working fluid in the vapor buffer tank to a condensate portion of the liquid phase of the working fluid in the vapor buffer tank.

7. The method of claim 1, further comprising:
   hermetically sealing the immersion chamber from the vapor buffer tank by closing a vapor valve between the immersion chamber and the vapor buffer tank, and
   hermetically sealing the immersion chamber from the liquid buffer tank by closing a liquid valve between the immersion chamber and the liquid buffer tank.

8. The method of claim 1, further comprising selectively allowing fluid communication between the vapor buffer tank and a headspace of the immersion chamber.

9. The method of claim 1, further comprising selectively allowing fluid communication between the liquid buffer tank and the immersion chamber.

10. The method of claim 1, further comprising before the selectively flowing, providing the liquid buffer tank with the supplemental volume of the liquid phase of the working fluid that is in addition to the primary volume of the liquid phase of the working fluid in the immersion chamber.

11. A method of thermal management of heat-generating components, the method comprising:
    disposing at least one of the heat-generating components in a working fluid in an immersion chamber, the working fluid having a liquid phase and a vapor phase;
    receiving heat from the at least one of the heat-generating components to the liquid phase of the working fluid in the immersion chamber;
    measuring one or more of a temperature or a pressure of the vapor phase of the working fluid in the immersion chamber;
    upon the one or more of the temperature or the pressure exceeding a threshold value, venting a portion of the vapor phase of the working fluid from the immersion chamber to a vapor buffer tank thereby decreasing an amount of the vapor phase of the working fluid in the immersion chamber;
    waiting a predetermined time period after the venting the portion of the vapor phase of the working fluid allowing the pressure of the vapor phase of the working fluid to decrease, and
    replenishing the working fluid in the immersion chamber after waiting the predetermined time period by pumping a supplemental quantity of the liquid phase of the working fluid from a liquid buffer tank into the immersion chamber.

12. A method of thermal management of heat-generating components, the method comprising:
    receiving heat from at least one heat-generating component of the heat-generating components with a primary volume of a liquid phase of a working fluid in an immersion chamber;
    measuring one or more of a temperature or a pressure in the immersion chamber;
    upon the one or more of the temperature or pressure exceeding a threshold value, venting a portion of a vapor phase of the working fluid from the immersion chamber to a vapor buffer tank; and
    waiting a predetermined time period after the venting, and then selectively flowing, from a supplemental volume of the liquid phase of the working fluid in a liquid buffer tank, a supplemental quantity of the liquid phase of the working fluid to the primary volume of the liquid phase of the working fluid in the immersion chamber.

* * * * *